US00RE35764E

United States Patent [19]

Casper et al.

[11] E Patent Number: Re. 35,764

[45] Reissued Date of Patent: Apr. 7, 1998

[54] INVERTING OUTPUT DRIVER CIRCUIT FOR REDUCING ELECTRON INJECTION INTO THE SUBSTRATE

[75] Inventors: Stephen L. Casper; Kevin G. Duesman, both of Boise, Id.

[73] Assignee: Micron Technology, Inc., Boise, Id.

[21] Appl. No.: 713,757

[22] Filed: Sep. 13, 1996

Related U.S. Patent Documents

Reissue of:

[64] Patent No.: 5,347,179
Issued: Sep. 13, 1994
Appl. No.: 48,158
Filed: Apr. 15, 1993

[51] Int. Cl.[6] ..... H03K 19/20

[52] U.S. Cl. ..... 326/122; 326/21; 326/112

[58] Field of Search ..... 326/21, 82, 83, 326/86, 121; 327/309–310

[56] References Cited

U.S. PATENT DOCUMENTS

| | | | |
|---|---|---|---|
| 4,275,313 | 6/1981 | Boll et al. | 307/448 |
| 4,347,447 | 8/1982 | Proebsting | 307/448 |
| 4,810,969 | 3/1989 | Fulkerson | 307/443 |
| 4,935,647 | 6/1990 | Larkins | 307/451 |
| 4,963,766 | 10/1990 | Lundberg | 326/81 X |
| 5,128,557 | 7/1992 | Milby et al. | 326/121 X |
| 5,160,885 | 11/1992 | Dobberpuhl | 326/21 X |

FOREIGN PATENT DOCUMENTS

3729926 A 1 9/1987 Germany .

4141885 C 1 12/1991 Germany .

*Primary Examiner*—David R. Hudspeth
*Attorney, Agent, or Firm*—Trask, Britt & Rossa

[57] ABSTRACT

A new inverting output driver circuit is disclosed that reduces electron injection into the substrate by the drain of the circuit's pull-up field effect transistor. This is accomplished by adding additional circuitry that allows the gate voltage of the pull-up transistor to track the source voltage. The output circuit makes use of an inverter having an output node (hereinafter the intermediate node) coupled to $V_{CC}$ through a first P-channel FET, and to ground through first and second series coupled N-channel FETs, respectively. The gates of the P-channel FET and the first N-channel FET are coupled to and controlled by an input node. The inverter output node controls the gate of third N-channel FET, through which a final output node is coupled to $V_{CC}$. The intermediate node is coupled to the final output node through a fourth N-channel FET, the gate of which is held at ground potential. The gate of the second N-channel FET is coupled to $V_{CC}$ through a second P-channel FET and to the final output node through a fifth N-channel FET which has much greater drive than the second P-channel FET; the gates of both the second P-channel FET and the fifth N-channel FET also being held at ground potential. Certain obvious variations of the circuit are possible. For example, the function of the first and second N-channel FETs may be reversed. In addition, the second P-channel FET functions as a resistor, and may be replaced with any device which functions as a resistor.

30 Claims, 6 Drawing Sheets

INVERTING OUTPUT DRIVER CIRCUIT FOR REDUCING ELECTRON INJECTION INTO THE SUBSTRATE

Matter enclosed in heavy brackets [ ] appears in the original patent but forms no part of this reissue specification; matter printed in italics indicates the additions made by reissue.

FIELD OF THE INVENTION

This invention relates to integrated circuit design and, more particularly, to output circuits (also referred to as buffer circuits) used in CMOS applications.

BACKGROUND OF THE INVENTION

FIG. 1 depicts a conventional output driver circuit. Given the assumption that the gate voltages on both transistor Q1 and transistor Q2 are at ground potential and that the output node O is low, reflections at a mismatched interface may cause output node O to fall below ground to, say, −1.0 volts. Under these conditions, the gate of transistor Q1 becomes positive with respect to the source. Consequently, the channel of transistor Q1 begins to conduct, and the source region of Q1 begins to generate free electron carriers. In an insulated-gate field effect transistor (hereinafter also FET), such as Q1, electric field intensity is greatest near the silicon-silicon dioxide interface where the drain junction is directly under the gate edge. As the free electron carriers from the source region pass through the high-field region near the drain, they can acquire energy far in excess of that which would be attributable solely to ambient temperature. In such a state, those electrons are considered "hot" carriers, and are capable of causing a number of "hot-carrier" effects. For a field effect transistor, the worst case scenario for hot electron generation is generally regarded to be a condition where gate-to-source voltage ($V_{GS}$) is about one-half drain-to-source voltage ($V_{DS}$).

In MOS memory circuits, "hot-carrier effects" can disturb circuit operation both by directly altering stored data values, and by permanently altering device performance. Although the vast majority of hot electron carriers are collected by the drain region, some leave the channel and travel to the gate through the gate oxide layer. Some of the electrons inevitably become trapped in the gate oxide layer, thereby shifting the threshold voltage of the device. Other electrons are injected into the substrate, through which they can migrate to the memory array where they are attracted by cells in which a logic value of "1" (i.e., a positive charge) is stored. Through this mechanism, data may become corrupted if the refresh cycle is not shortened to compensate for the charge loss. Electron injection into the substrate can also precipitate a latch-up condition in CMOS circuits.

The very structure required to fabricate bulk CMOS circuitry makes it susceptible to latchup. To have both N-channel and P-channel field effect transistors, it is necessary to have both P-type and N-type background material. Typically, the CMOS fabrication process begins with a silicon wafer of a single conductivity type. Regions of the opposite conductivity type, known as wells or tubs, are created it by diffusing or implanting dopant species, which overwhelm the original dopant. For circuitry constructed on a p-type wafer, P-channel FETs are built in an N-well, while N-channel FETs are built directly in the P-type wafer substrate. Unfortunately, the FETs are not the only structures fabricated. PNPN devices consisting of parasitic bipolar transistors are also created. Under certain operational conditions, these PNPN devices can generate a $V_{CC}$ (power supply voltage) to ground short that can destroy the circuitry.

Some designers have addressed the electron injection problem in output driver circuits by replacing FET Q1 of FIG. 1 with a pair of FETS, Q3 and Q4. Such a circuit is depicted in FIG. 2. Such an approach is effective in reducing electron injection when the output node O drops below ground potential, as transistors Q3 and Q4 act to divide the voltage drop between $V_{CC}$ and the output node. However, the area required for both FETs Q3 and Q4 is approximately four times that required for transistor Q1 of FIG. 1. Thus, this solution for reducing electron injection has its costs, which for a typical memory circuit can be significant.

What is needed is a new, space-efficient driver circuit that will reduce electron injection into the substrate.

SUMMARY OF THE INVENTION

A new inverting output driver circuit is disclosed that reduces electron injection into the substrate by the drain of the circuit's pull-up field effect transistor. This is accomplished by adding additional circuitry that allows the gate voltage of the pull-up transistor to track the source voltage. The output circuit makes use of a tri-state inverter having an output node (hereinafter the intermediate node) coupled to $V_{CC}$ through a first P-channel FET, and to ground through first and second series coupled N-channel FETs, respectively. The gates of the P-channel FET and the first N-channel FET are coupled to and controlled by an input node. The intermediate node controls the gate of third N-channel FET, through which a final output node is coupled to $V_{CC}$. The intermediate node is coupled to the final output node through a fourth N-channel FET, the gate of which is held at ground potential. The gate of the second N-channel FET is coupled to $V_{CC}$ through a second P-channel FET and to the final output node through a fifth N-channel FET which has much greater drive than the second P-channel FET; the gates of both the second P-channel FET and the fifth N-channel FET also being held at ground potential. When the final output is greater than ground potential, the gate of the second N-channel FET is at $V_{CC}$. Thus the channel of the second N-channel is conductive. However, when the final output node drops below ground potential, gate voltage is greater than source voltage for both the fourth and the fifth N-channel FETs, thus causing both FETs to conduct. This results in the gate of the second N-channel FET being pulled to below ground potential, cutting off current flow through that FET. Simultaneously, the intermediate node is directly coupled to the final output node through the fourth N-channel FET, so that the voltage on the gate of the third N-channel FET tracks the source voltage thereon. Thus, current flow through the third N-channel FET is cut off and hot electron injection is mitigated. Certain variations of the circuit are possible. For example, the function of the first and second N-channel FETs may be reversed. In addition, the second P-channel FET functions as a resistor, and may be replaced with any device which functions as a resistor, including a sixth N-channel FET having its gate tied to $V_{CC}$ or a doped or undoped polycrystalline silicon resistor.

PREFERRED EMBODIMENT OF THE INVENTION

Figure 3:
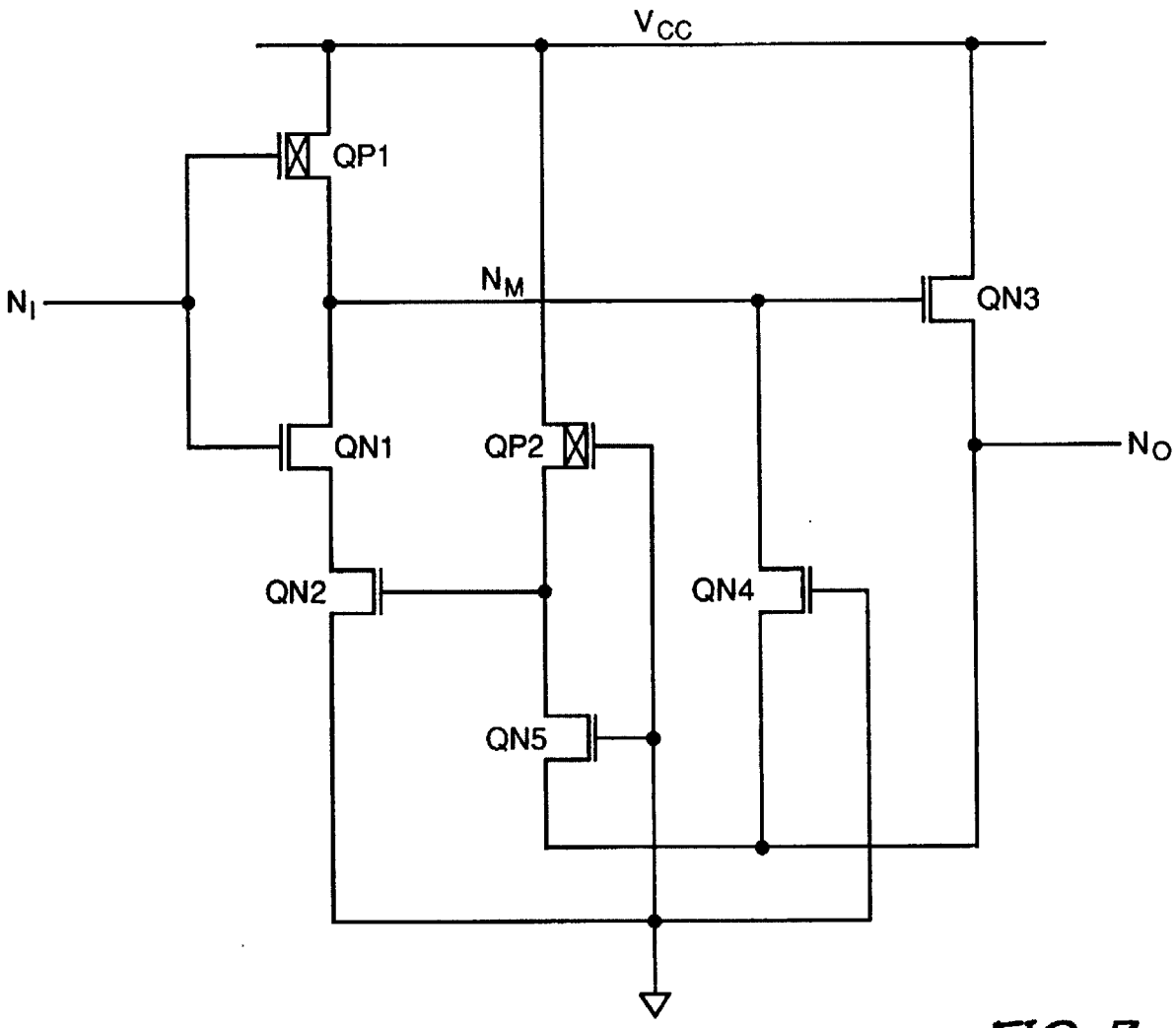
FIG. 3 is a circuit diagram of a first embodiment of the new, space-efficient output driver circuit which reduces hot electron injection.

Referring now to FIG. 3, a first embodiment of the new, space-efficient output driver circuit has an intermediate node $N_M$ that is coupled to a power supply voltage ($V_{CC}$) through a first P-channel FET QP1, and to ground through a first N-channel FET QN1 and a second N-channel FET QN2, QN1 and QN2 being series coupled, with QN1 being electrically nearer node $N_M$. The gates of FET QP1 and FET QN1 are coupled to and controlled by an input node $N_I$. It should be understood that FETs QP1, QN1 and QN2 can be operated as a tri-state inverter. The intermediate node $N_M$ is coupled to and controls the gate of a third N-channel FET QN3, (also referred to herein as the output node pull-up transistor) through which a final output node $N_O$ is coupled to $V_{CC}$. The intermediate node $N_M$ is coupled to the node $N_O$ through a fourth N-channel FET QN4, the gate of which is permanently held at ground potential. The gate of FET QN2 is coupled to $V_{CC}$ through a second P-channel FET QP2, and to the final output node $N_O$ through a fifth N-channel FET QN5, which has much greater drive than FET QP2. The gates of both the FET QP2 and FET QN5 are also permanently held at ground potential. When the potential on the final output node $N_O$ is greater than ground potential, the gate of FET QN2 is at $V_{CC}$. Thus the channel of FET QN2 is conductive. However, when the final output node $N_O$ drops below ground potential, gate voltage is greater than source voltage for both FET QN4 and FET QN5, thus causing the channels of both of these FETs to conduct. This results in the gate of FET QN2 being pulled to below ground potential, which reduces current flow through that FET (If the magnitude of the drop below ground potential is sufficient, current flow through FET QN2 will be cut off entirely). Simultaneous with the drop in current flow through FET QN2, the intermediate node $N_M$ is directly coupled to the final output node $N_O$ through FET QN4, so that the voltage on the gate of the FET QN3 tracks the source voltage thereon. Thus, current flow through FET QN3 is reduced or cut off, and hot electron injection into the substrate is mitigated.

Figure 4:
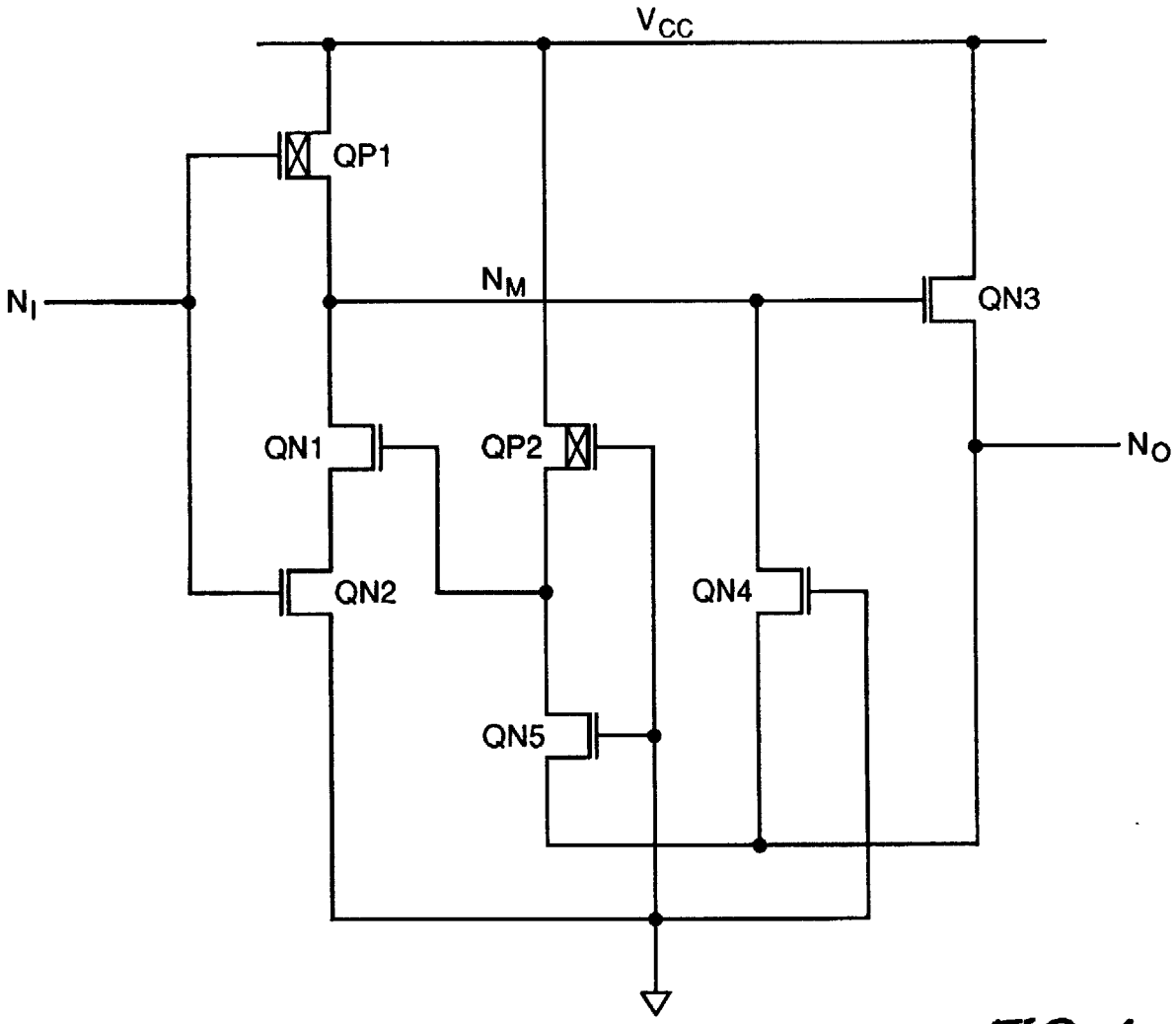
FIG. 4 is a circuit diagram of a second embodiment of the new, space-efficient output driver circuit which reduces hot electron injection.

Referring now to FIG. 4, a second embodiment of the new output driver circuit similar to the first embodiment, with the exception that FET QN2 is coupled to the input node $N_I$, and FET QN1 is coupled to $V_{CC}$ through FET QP2 and to the final output node $N_O$ through FET QN5.

Figure 5:
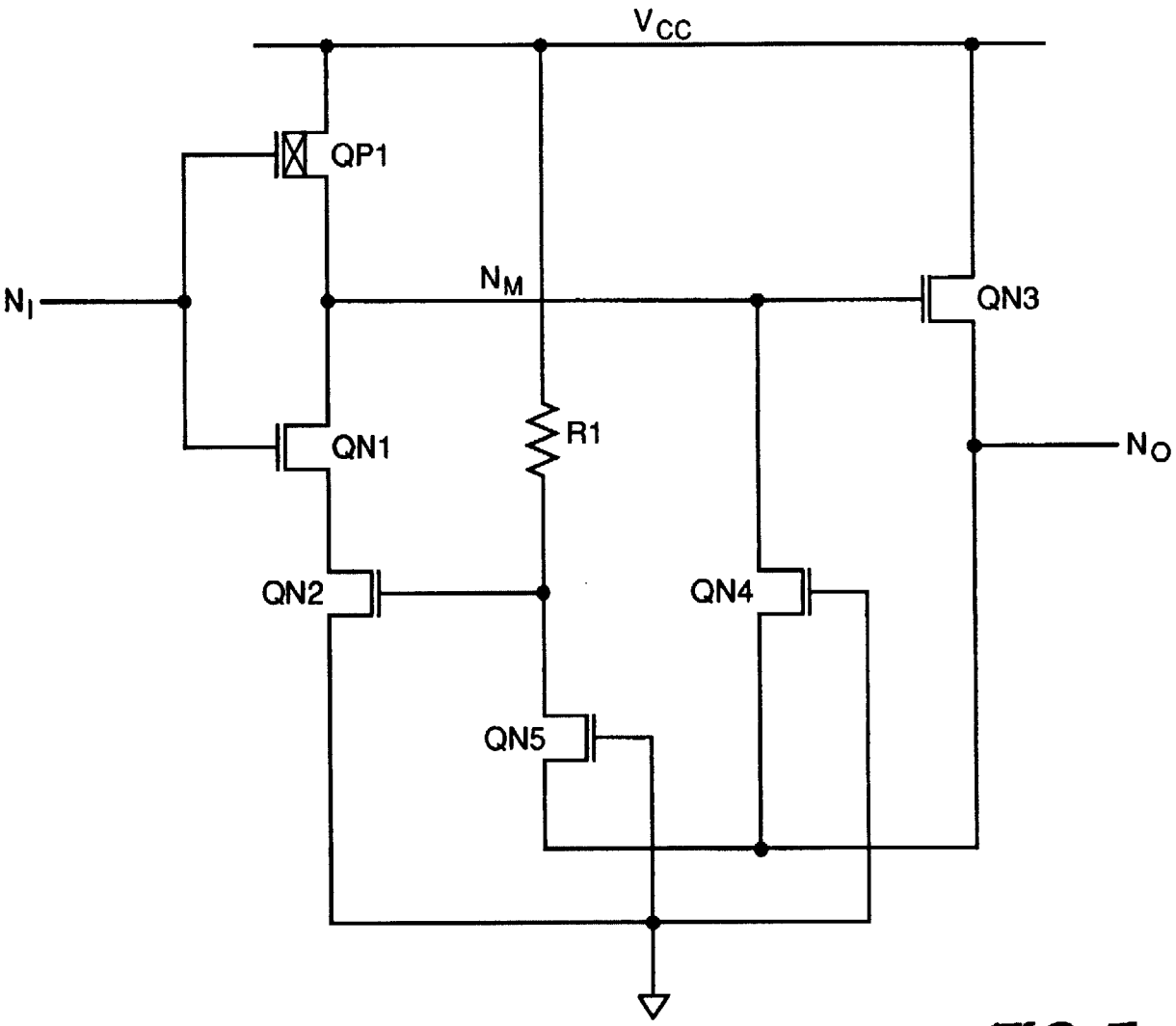
FIG. 5 is a circuit diagram of the first embodiment of the new, space-efficient output driver circuit, but with the second P-channel FET replaced by a resistor.
Figure 6:
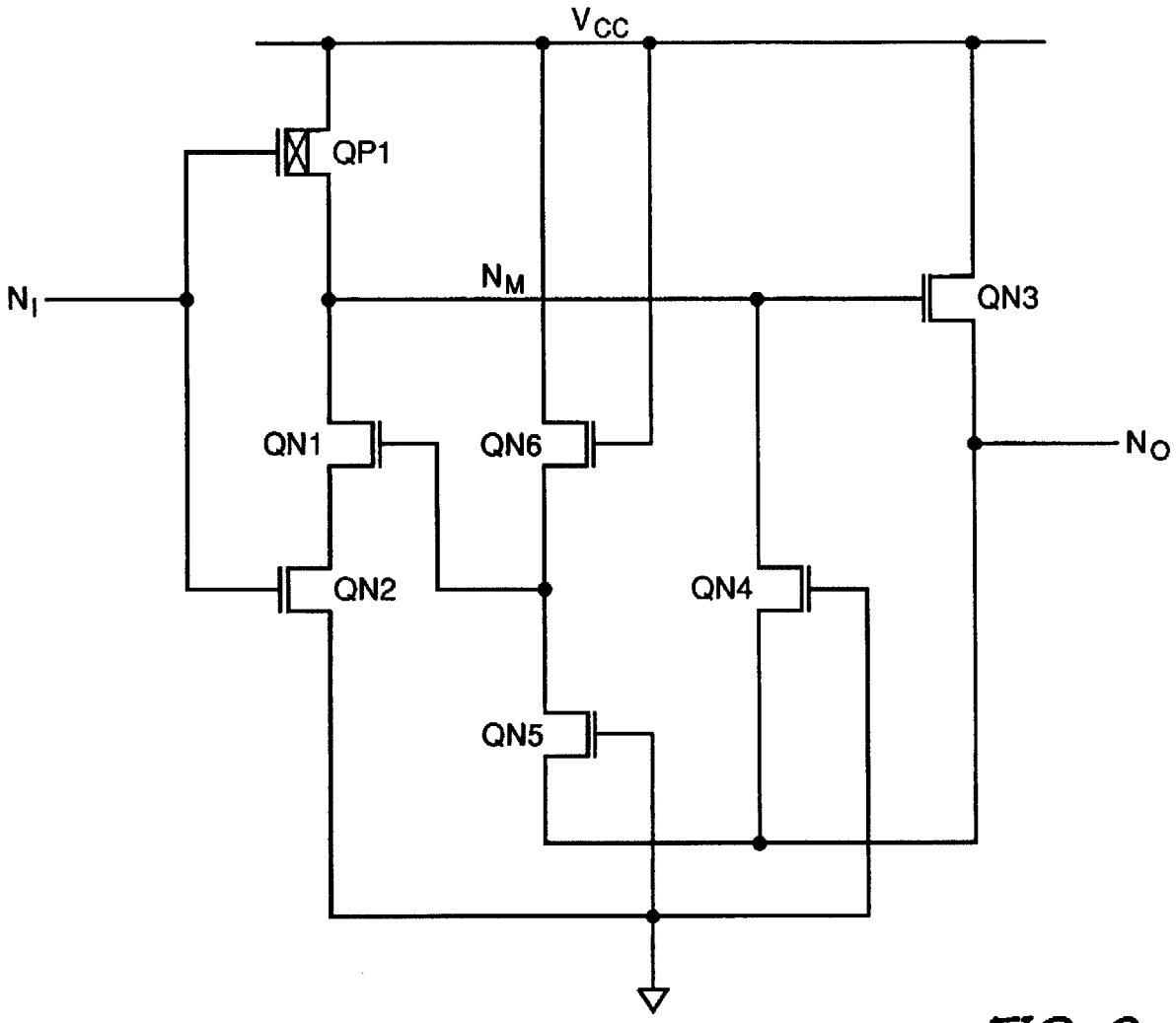
FIG. 6 is a circuit diagram of the second embodiment of the new, space-efficient output driver circuit, but with the second P-channel FET replaced by an N-channel FET having its gate coupled to $V_{CC}$.

It will be noted that the second P-channel FET QP2 functions as a resistor. Hence, it may be replaced by any device which functions as a resistor, including a low-drive N-channel FET having its gate coupled to $V_{CC}$ or a strip of doped or undoped polycrystalline silicon which provides the desired current flow. FIG. 5 depicts the embodiment of FIG. 3 with FET QP2 replaced by a resistor R1. Likewise, FIG. 6 depicts the embodiment of FIG. 4, but with FET QP2 replaced by an N-channel FET QN6 having its gate coupled to $V_{CC}$.

Figure 2:
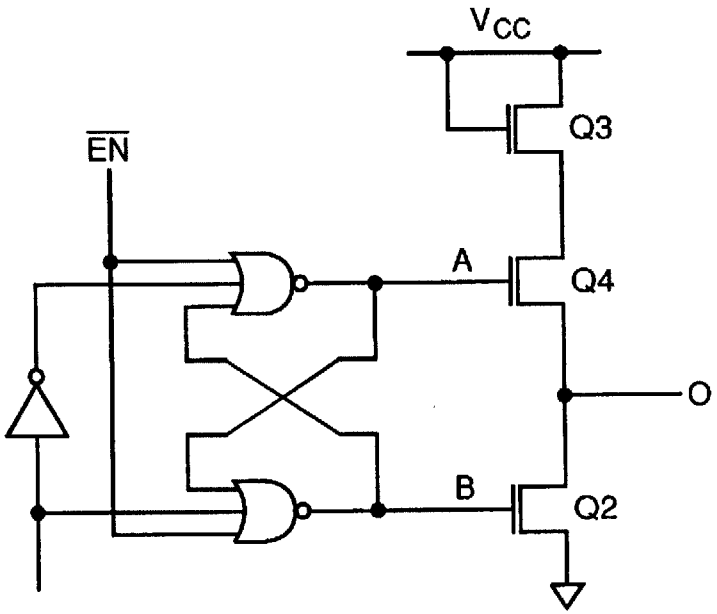
FIG. 2 is a circuit diagram of a prior-art triple N-channel output driver which reduces hot electron injection.
Figure 1:
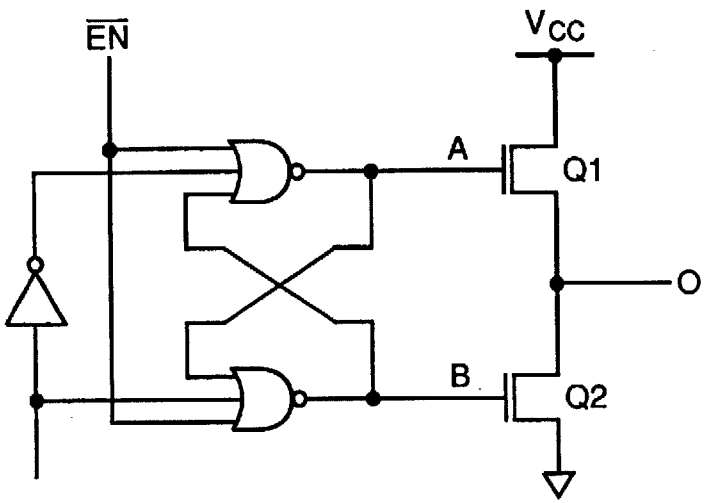
FIG. 1 is a circuit diagram of a conventional, double N-channel output driver.

The new output driver circuit has a definite space-savings advantage over the circuit depicted in FIG. 2. Although the area required for both FETs Q3 and Q4 of FIG. 2 is approximately four times that required for transistor Q1 of FIG. 1, the total space required for FETs QP1, QP2, QN2, QN3, QN4, and QN5 is approximately one half that required for FETs Q3 and Q4 of FIG. 2.

Figure 7:
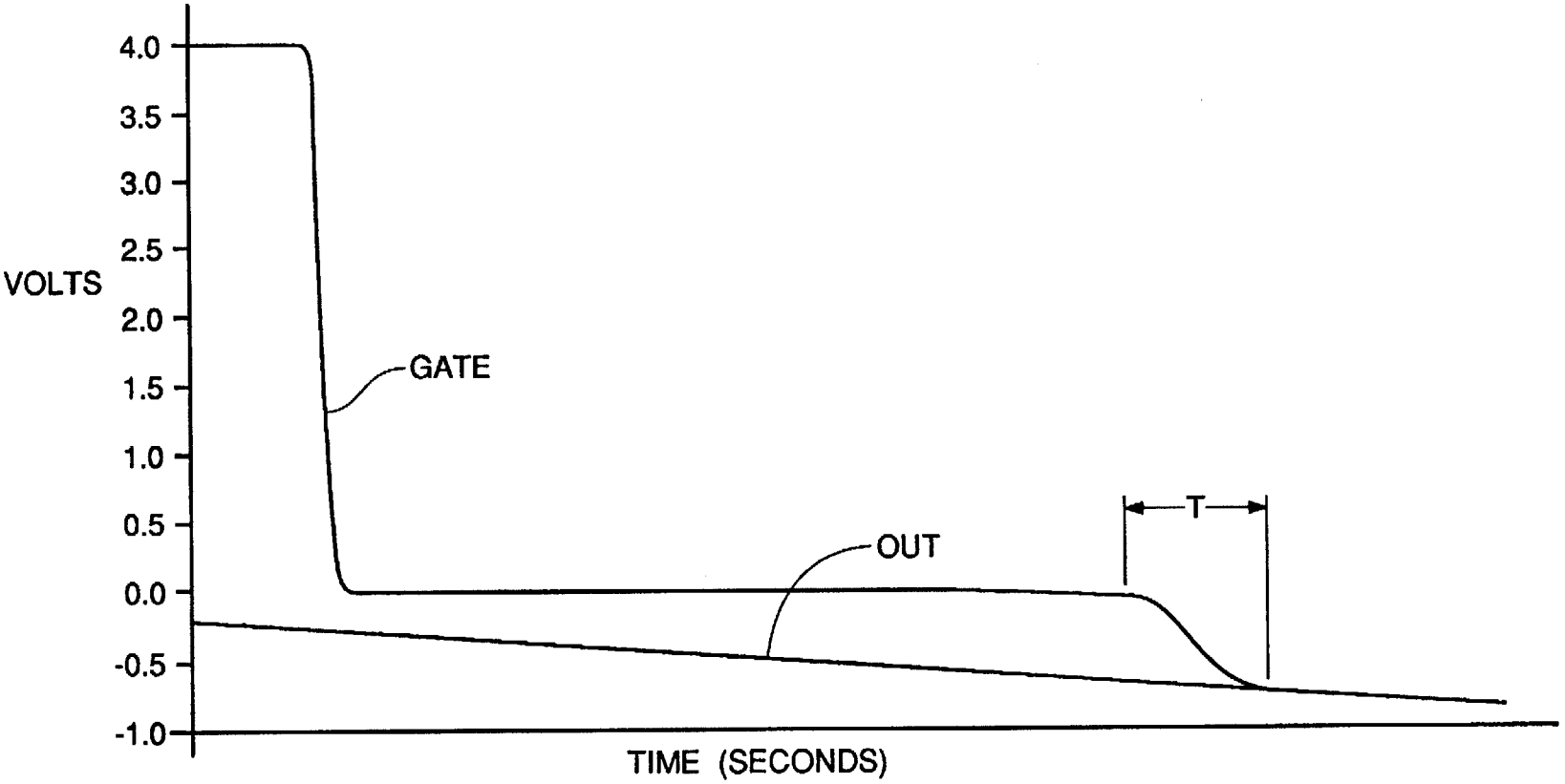
FIG. 7 is a plot of gate voltage on FET QN3 vs. final output node voltage.

Referring now to FIG. 7, gate voltage on FET QN3 and voltage on the final output node $N_O$ are both plotted as a function of time. It will be observed that when the voltage on the final output node $N_O$ drops more than a threshold voltage below ground potential, both FET QN4 and FET QN5 begin to turn on, with the result that after a transition period T, the gate voltage is clamped to the final output node. As a practical matter, the output should only drop below ground potential when there is a high logic level at the input, and the intermediate node and the final output node are at low logic levels.

Although only several embodiments of the new space-efficient, hot electron injection mitigating driver circuit is depicted, it will be obvious to those having ordinary skill in the art of integrated circuit design that changes and modifications may be made thereto without departing from the spirit and the scope of the invention as hereinafter claimed.

We claim:

1. A space-efficient, inverting output driver circuit that reduces hot electron injection, said circuit comprising:

first and second P-channel FETs;

first, second, third, fourth and fifth N-channel FETs;

each P-channel FET and each N-channel FET having, by definition, a gate, a source region, a drain region, and a channel region;

said fifth N-channel FET having greater drive than said second P-channel FET;

the gate of the second N-channel FET being coupled to a power supply voltage ($V_{CC}$) through the second P-channel FET;

the gates of the second P-channel FET, the fourth N-channel FET, and the fifth N-channel FET being permanently held at ground potential;

an input node which is coupled to the gates of the first P-channel FET and the first N-channel FET;

an intermediate node that is coupled to a power supply voltage ($V_{CC}$) through the first P-channel FET, and to ground through both the first N-channel FET and the second N-channel FET, said first and second N-channel FETs being series coupled, with the first N-channel FET being electrically nearer the intermediate node;

said intermediate node being coupled to the gate of the third N-channel FET; and a final output node that is coupled to $V_{CC}$ through the third N-channel FET, to the intermediate node through the fourth N-channel FET, and to the gate of the second N-channel FET through the fifth N-channel FET.

2. The inverting output driver circuit of claim 1, wherein said fifth N-channel FET has at least double the drive of said second P-channel FET.

3. The inverting output driver circuit of claim 2, wherein gate-to-source voltage is maintained at less than threshold voltage for the third N-channel FET when the potential on the final output node is less than ground potential.

4. A space-efficient, inverting output driver circuit that reduces hot electron injection, said circuit comprising:

first and second P-channel FETs;

first, second, third, fourth and fifth N-channel FETs;

each P-channel FET and each N-channel FET having, by definition, a gate, a source region, a drain region, and a channel region;

said fifth N-channel FET having greater drive than said first P-channel FET;

the gate of the first N-channel FET being coupled to a power supply voltage ($V_{CC}$) through the second P-channel FET;

the gates of the second P-channel FET, the fourth N-channel FET, and the fifth N-channel FET being permanently held at ground potential;

an input node which is coupled to the gates of the first P-channel FET and the second N-channel FET;

an intermediate node that is coupled to a power supply voltage ($V_{CC}$) through the first P-channel FET, and to ground through both the first N-channel FET and the second N-channel FET, said first and second N-channel FETs being series coupled, with the first N-channel FET being electrically nearer the intermediate node;

said intermediate node being coupled to the gate of the third N-channel FET; and a final output node that is coupled to $V_{CC}$ through the third N-channel FET, to the intermediate node through the fourth N-channel FET, and to the gate of the first N-channel FET through the fifth N-channel FET.

5. The inverting output driver circuit of claim 4, wherein said fifth N-channel FET has at least double the drive of said second P-channel FET.

6. The inverting output driver circuit of claim 5, wherein gate-to-source voltage is maintained at less than threshold voltage for the third N-channel FET when the potential on the final output node is less than ground potential.

7. An output driver circuit comprising:

an N-channel pull-up field effect transistor for coupling a final output node to a power supply voltage bus;

an intermediate node coupled to the gate of said pull-up transistor;

a tri-state inverter circuit which couples an input node to said intermediate node;

means for clamping the intermediate node to the final output node whenever the intermediate node is in a low logic state, and the final output node drops more than a threshold voltage below ground potential.

8. The output driver circuit of claim 7, wherein said tristate inverter circuit comprises:

a P-channel pull-up field-effect transistor coupled between the power supply voltage bus and said intermediate node;

a pair of N-channel pull-down field-effect transistors, said pair of N-channel FETs being series coupled between said intermediate node and a ground bus;

the gate of one of said pair being coupled to said input node, the gate of the other of said pair being coupled to the power supply voltage bus when the final output node is above ground potential, but when the output node drops below ground potential, the gate of the other of said pair is coupled to said output node;

said input node being coupled to the gate of the P-channel pull-up transistor and to the gate of one of said pair of N-channel pull-down transistors.

9. The output driver circuit of claim 8, wherein said means for clamping comprises means for simultaneously disconnecting the intermediate node from ground potential and means for connecting the intermediate node to the final output node, said means for disconnecting and said means for connecting being simultaneously activatable.

10. The output driver circuit of claim 9, wherein said means for disconnecting comprises an additional N-channel field-effect transistor in an electrical path which selectively couples said intermediate node to ground, and said means for connecting comprises still another N-channel field-effect transistor which selectively couples said intermediate node to the final output node, both instances of selective coupling occurring in response to a negative voltage at the final output node.

11. The output driver circuit of claim 10, wherein the gate of the N-channel field effect transistor which selectively couples said intermediate node to the final output node is permanently tied to ground potential.

12. The output driver circuit of claim 10, wherein the gate of the N-channel field-effect transistor in the electrical path which selectively couples said intermediate node to ground, is tied to a node which is coupled to $V_{CC}$ through a device which functions as a resistor, and to the final output node through yet another N-channel field-effect transistor, the gate of this last transistor being permanently tied to ground potential.

13. The output driver circuit of claim 12, wherein the device which functions as a resistor is a P-channel field-effect transistor having its gate tied to ground potential.

14. The output driver circuit of claim 12, wherein the device which functions as a resistor is an N-channel field-effect transistor having its gate tied to $V_{CC}$.

15. A space-efficient, inverting output driver circuit that reduces hot electron injection, said circuit comprising:

a first P-channel FET;

first, second, third, fourth and fifth N-channel FETs;

each P-channel FET and each N-channel FET having, by definition, a gate, a source region, a drain region, and a channel region;

a resistive device;

said fifth N-channel FET having greater drive than said resistive device;

the gate of the second N-channel FET being coupled to a power supply voltage ($V_{CC}$) through the resistive device;

the gates of the fourth N-channel FET, and the fifth N-channel FET being permanently held at ground potential;

an input node which is coupled to the gates of the first P-channel FET and the first N-channel FET;

an intermediate node that is coupled to a power supply voltage ($V_{CC}$) through the first P-channel FET, and to ground through both the first N-channel FET and the second N-channel FET, said first and second N-channel FETs being series coupled, with the first N-channel FET being electrically nearer the intermediate node;

said intermediate node being coupled to the gate of the third N-channel FET; and a final output node that is coupled to $V_{CC}$ through the third N-channel FET, to the intermediate node through the fourth N-channel FET, and to the gate of the second N-channel FET through the fifth N-channel FET.

16. The inverting output driver circuit of claim 15, wherein said resistive device is a second P-channel FET having its gate permanently held at ground potential.

17. The inverting output driver circuit of claim 15, wherein said resistive device is a sixth N-channel FET having its gate permanently held at a potential of $V_{CC}$.

18. A space-efficient, inverting output driver circuit that reduces hot electron injection, said circuit comprising:

a first P-channel FET;

first, second, third, fourth and fifth N-channel FETs;

each P-channel FET and each N-channel FET having, by definition, a gate, a source region, a drain region, and a channel region;

a resistive device;

said fifth N-channel FET having greater drive than said resistive device;

the gate of the first N-channel FET being coupled to a power supply voltage ($V_{CC}$) through the resistive device;

the gates of the fourth N-channel FET, and the fifth N-channel FET being permanently held at ground potential;

an input node which is coupled to the gates of the first P-channel FET and the second N-channel FET;

an intermediate node that is coupled to a power supply voltage ($V_{CC}$) through the first P-channel FET, and to ground through both the first N-channel FET and the second N-channel-FET, said first and second N-channel FETs being series coupled, with the first N-channel FET being electrically nearer the intermediate node;

said intermediate node being coupled to the gate of the third N-channel FET; and a final output node that is coupled to $V_{CC}$ through the third N-channel FET, to the intermediate node through the fourth N-channel FET, and to the gate of the first N-channel FET through the fifth N-channel FET.

19. The inverting output driver circuit of claim 18, wherein said resistive device is a second P-channel FET having its gate permanently held at ground potential.

20. The inverting output driver circuit of claim 18, wherein said resistive device is a sixth N-channel FET having its gate permanently held at a potential of $V_{CC}$.

*21. An output driver circuit comprising:*

*a P-channel FET;*

*a resistive device;*

*first, second, third, fourth, and fifth N-channel FETs;*

*a gate of the second N-channel FET being coupled to a supply voltage through the resistive device; and*

*gates of the fourth and fifth N-channel FETs being coupled to a reference voltage;*

*an input node coupled to gates of the P-channel FET and the first N-channel FET;*

*an intermediate node coupled to the supply voltage through the P-channel FET and to the reference voltage through the first and second N-channel FETs;*

*said intermediate node being coupled to a gate of the third N-channel FET; and*

*an output node coupled to the supply voltage through the third N-channel FET, to the intermediate node through the fourth N-channel FET, and to the gate of the second N-channel FET through the fifth N-channel FET.*

*22. The output driver circuit of claim 21 wherein the resistive device is selected from a group comprising another P-channel FET having a gate coupled to the reference voltage, a sixth N-channel FET having a gate coupled to the supply voltage, a resistor, and a strip of polycrystalline silicon.*

*23. The output driver circuit of claim 21 wherein a drain of the first N-channel FET is coupled to the intermediate node and the source of the second N-channel FET is coupled to the reference voltage.*

*24. An output driver circuit comprising:*

*an output node;*

*a pull-up FET for coupling the output node to a supply voltage;*

*an intermediate node coupled to a gate of the FET;*

*an input node;*

*input circuitry for coupling the input node to the intermediate node; and*

*clamping circuitry for clamping the intermediate node to the output node when a voltage at the output node drops at least a threshold voltage below a reference voltage.*

*25. The output driver circuit of claim 24 wherein the input circuitry comprises a tri-state inverter circuit.*

*26. The output driver circuit of claim 24 wherein the pull-up FET comprises a pull-up N-channel FET.*

*27. The output driver circuit of claim 24 wherein the input circuitry includes first and second N-channel FETs coupled in series between the intermediate node and the reference voltage, wherein the clamping circuitry comprises:*

*a P-channel FET having a gate coupled to the reference voltage, a source coupled to the supply voltage, and a drain coupled to a gate of one of the first and second N-channel FETs;*

*a third N-channel FET having a gate coupled to the reference voltage, a source coupled to the output node, and a drain coupled to the drain of the P-channel FET; and*

*a fourth N-channel FET having a gate coupled to the reference voltage, a source coupled to the output node, and a drain coupled to the intermediate node.*

*28. A circuit for clamping a gate of an output driver FET to a source of the output driver FET in response to an output voltage at the source dropping below a reference voltage at the gate by at least a threshold voltage, the circuit comprising:*

*first switching circuitry for isolating the gate from the reference voltage in response to the output voltage dropping below the reference voltage by at least the threshold voltage; and*

*second switching circuitry for coupling the gate to the source in response to the output voltage dropping below the reference voltage by at least the threshold voltage.*

*29. The circuit of claim 28 wherein the first switching circuitry comprises:*

*a first N-channel FET having a gate, a source coupled to the reference voltage, and a drain selectively coupled to the gate of the output driver FET;*

*a resistive device for coupling the gate of the first N-channel FET to a supply voltage; and*

*a second N-channel FET having a gate coupled to the reference voltage, a source coupled to the source of the output driver FET, and a drain coupled to the gate of the first N-channel FET.*

*30. The circuit of claim 28 wherein the second switching circuitry comprises an N-channel FET having a gate coupled to the reference voltage, a source coupled to the source of the output driver FET, and a drain coupled to the gate of the output driver FET.*

* * * * *